United States Patent
Huff

(10) Patent No.: US 10,886,104 B2
(45) Date of Patent: Jan. 5, 2021

(54) ADAPTIVE PLASMA IGNITION

(71) Applicant: Advanced Energy Industries, Inc., Fort Collins, CO (US)

(72) Inventor: Robert B. Huff, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/436,601

(22) Filed: Jun. 10, 2019

(65) Prior Publication Data

US 2020/0388466 A1  Dec. 10, 2020

(51) Int. Cl.
  *H01J 37/32* (2006.01)

(52) U.S. Cl.
  CPC ... *H01J 37/32009* (2013.01); *H01J 2237/327* (2013.01)

(58) Field of Classification Search
  None
  See application file for complete search history.

(56) References Cited

U.S. PATENT DOCUMENTS

| | | | |
|---|---|---|---|
| 5,916,455 A | 6/1999 | Kumagai | |
| 6,080,270 A | 6/2000 | Tabrez et al. | |
| 6,150,628 A | 11/2000 | Smith et al. | |
| 6,156,164 A | 12/2000 | Smolanoff et al. | |
| 6,190,512 B1 | 2/2001 | Lantsman | |
| 6,204,604 B1 | 3/2001 | Donohoe | |
| 6,409,896 B2 | 6/2002 | Crocker | |
| 6,633,017 B1 | 10/2003 | Drummond et al. | |
| 7,161,818 B2 | 1/2007 | Kirchmeier et al. | |
| 7,422,664 B2 | 9/2008 | Ritchie et al. | |
| 8,044,594 B2 | 10/2011 | Frost et al. | |
| 8,692,466 B2 | 4/2014 | Benzerrouk et al. | |
| 9,194,045 B2 * | 11/2015 | Wu | C23C 14/345 |
| 9,309,594 B2 * | 4/2016 | Hoffman | C23C 14/345 |
| 9,524,854 B2 * | 12/2016 | Hoffman | H01J 37/32357 |
| 9,536,713 B2 * | 1/2017 | Van Zyl | H01J 37/32935 |
| 9,577,516 B1 * | 2/2017 | Van Zyl | H02M 3/155 |
| 9,578,731 B2 * | 2/2017 | Van Zyl | H05H 1/46 |
| 9,685,297 B2 * | 6/2017 | Carter | H01J 37/32944 |
| 9,736,920 B2 | 8/2017 | Smith et al. | |
| 9,748,076 B1 * | 8/2017 | Choi | H01J 37/32935 |
| 9,756,713 B2 | 9/2017 | Liechti et al. | |
| 9,767,988 B2 * | 9/2017 | Brouk | H01J 37/32009 |
| 9,807,863 B1 * | 10/2017 | Van Zyl | H03F 3/193 |
| 10,194,518 B2 * | 1/2019 | Van Zyl | H05H 1/46 |
| 10,269,540 B1 * | 4/2019 | Carter | H01J 37/32183 |

(Continued)

*Primary Examiner* — Amy Cohen Johnson
*Assistant Examiner* — Srinivas Sathiraju
(74) *Attorney, Agent, or Firm* — Neugeboren O'Dowd PC

(57) ABSTRACT

Systems and methods for adaptive plasma ignition are disclosed. A method includes assessing each of N voltage waveforms, wherein the assessing includes: selecting, from among the N voltage waveforms, a particular voltage waveform to apply to a plasma processing chamber, applying, repeatedly, the particular voltage waveform to the plasma processing chamber, wherein each application of the particular voltage waveform results in plasma ignition, and obtaining, each time a plasma is ignited in the plasma chamber, ignition-parameter values of each voltage waveform. An ignition profile may be created and stored in an ignition datastore for the particular voltage waveform, wherein the ignition profile is based upon the ignition-parameter values.

13 Claims, 7 Drawing Sheets

(56) References Cited

U.S. PATENT DOCUMENTS

| | | | |
|---|---|---|---|
| 10,314,156 B2 * | 6/2019 | Van Zyl | H03F 3/193 |
| 10,447,174 B1 * | 10/2019 | Porter, Jr. | H02M 3/158 |
| 2004/0025791 A1 | 2/2004 | Chen et al. | |
| 2010/0140231 A1 | 6/2010 | Ilic | |
| 2011/0259851 A1 | 10/2011 | Brouk et al. | |
| 2012/0217221 A1 | 8/2012 | Brouk et al. | |
| 2012/0247441 A1 | 10/2012 | Schultz | |
| 2014/0239813 A1 * | 8/2014 | Van Zyl | H01J 37/32935 |
| | | | 315/111.21 |
| 2018/0146538 A1 * | 5/2018 | Van Zyl | H03F 3/193 |
| 2018/0277377 A1 * | 9/2018 | Eto | H01J 37/244 |
| 2019/0148114 A1 * | 5/2019 | Wu | H01J 37/32183 |
| | | | 156/345.48 |
| 2019/0326093 A1 * | 10/2019 | Gurov | H01J 37/32183 |

* cited by examiner

ADAPTIVE PLASMA IGNITION

BACKGROUND

Field

The present disclosure relates generally to plasma processing. In particular, but not by way of limitation, the present disclosure relates to systems, methods and apparatuses for providing power during plasma ignition.

Background

Plasma processes are widely used in many industries, such as the semiconductor manufacturing industry. One method of generating a plasma is to drive a current through a low-pressure gas between two conducting electrodes that are positioned parallel to each other. Once certain parameters are met, the gas "breaks down" to form the plasma. For example, a plasma can be generated by applying a potential between two parallel conducting electrodes in a low-pressure atmosphere.

Plasma etching is commonly used to etch substrate material and films deposited on substrates in the electronics industry. Examples of plasma etching processes that are used to remove material from surfaces include: sputter-etching, pure chemical etching, ion energy driven etching, and ion inhibitor etching.

Plasma sputtering is a technique that is widely used for depositing films on substrates and other work pieces. Sputtering is the physical ejection of atoms from a target surface and is sometimes referred to as physical vapor deposition (PVD). In general, ions are generated and are then drawn out of the plasma and accelerated across a cathode dark space. The target surface has a lower potential than the region in which the plasma is formed. Therefore, the target surface attracts positive ions.

Positive ions move towards the target with a high velocity and then impact the target and cause atoms to physically dislodge or sputter from the target surface. The sputtered atoms then propagate to a substrate or other work piece where they deposit a film of sputtered target material.

Reactive sputtering systems inject a reactive gas or mixture of reactive gases into the sputtering system. The reactive gases react with the target material either at the target surface or in the gas phase, resulting in the deposition of new compounds. The pressure of the reactive gas can be varied to control the stoichiometry of the film. Reactive sputtering is useful for forming some types of molecular thin films.

Magnetron sputtering systems use magnetic fields that are shaped to trap and concentrate secondary electrons proximate to the target surface. The magnetic fields increase the density of electrons and, therefore, increase the plasma density in a region that is proximate to the target surface. The increased plasma density increases the sputter deposition rate.

In order for plasma to form in a plasma chamber during the creation of thin films or other applications, a power generator often creates an electric potential between a cathode and anode within the plasma chamber. This causes ignition of a processing gas into the plasma. The plasma then acts upon the cathode to create the thin film upon a substrate within the chamber.

In many plasma processing applications, consistent, repeatable ignition is desired, and in some plasma processing applications, rapid plasma ignition is desired. But plasma processes have many variables affecting ignition behavior. For example, gas pressure, chamber size, cathode material, and the type of substrate being processed can affect ignition behavior, and current plasma ignition approaches to accommodate the variations affecting plasma ignition behavior are deficient. Thus, improved systems and methodologies are needed to meet the operational aspects of plasma ignition.

SUMMARY

According to an aspect, a system for igniting a plasma in a plasma chamber is disclosed. The system includes a waveform generator configured to produce and apply voltage waveforms to a plasma processing chamber. The ignition characterization component is configured, for each of N voltage waveforms, to repeatedly apply each voltage waveform to the output port; obtain, each time a plasma is ignited in the plasma chamber, ignition-parameter values of each voltage waveform; and create and store an ignition profile in an ignition datastore for each voltage waveform. An ignition component is configured to access the ignition datastore to select and prompt the waveform generator to apply a particular voltage waveform to the output based upon a particular ignition profile for the particular voltage waveform.

According to another aspect, a method for adaptive plasma ignition is disclosed. The method includes selecting, from among N voltage waveforms, a particular voltage waveform to apply to a plasma processing chamber and applying, repeatedly, the particular voltage waveform to the plasma processing chamber, wherein each application of the particular voltage waveform results in plasma ignition. Each time a plasma is ignited in the plasma chamber, ignition-parameter values are obtained. An ignition profile is then created and stored in an ignition datastore for the particular voltage waveform.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
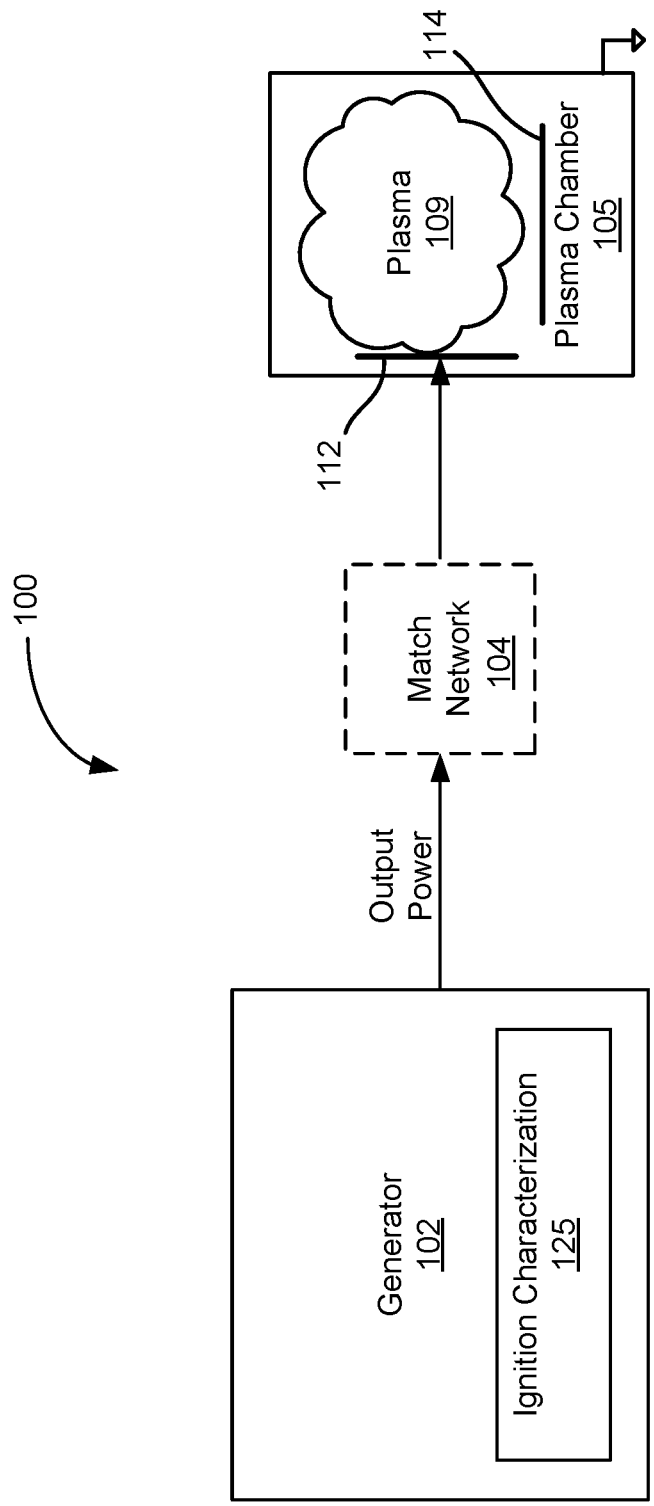
FIG. 1 is a block diagram depicting an environment in which aspects may be implemented.

Referring first to FIG. 1, shown is a block diagram depicting an exemplary plasma processing system 100 in which aspects of the present disclosure may be implemented. In FIG. 1, the plasma processing system 100 includes a generator 102, which applies power to a plasma 109 in plasma processing chamber 105 via a cathode 112. Also shown in the plasma chamber 105 is a workpiece 114. The generator 102 may be coupled directly (without a match network 104) or indirectly via one or more matching networks 104 to the cathode 112. As shown, the plasma chamber 105 may be grounded, but this is not required in many embodiments.

Although not limited to sputtering applications, several use cases disclosed herein are discussed in the context of sputtering applications. But many of the plasma ignition systems and methodologies disclosed herein are generally applicable to any type of plasma processing application. Concomitantly, the disposition and configuration of electrodes within the plasma chamber 105 may vary substantially from the configuration depicted in FIG. 1.

In the context of sputtering applications, one or more thin films may be deposited on the workpiece 114. As discussed above, sputtering is the physical ejection of material from a target surface (which may be coupled to the cathode 112) and is sometimes referred to as physical vapor deposition (PVD). Ions are drawn out of the plasma 109 and accelerated across a cathode dark space. The target surface has a lower potential than the region in which the plasma 109 is formed. Therefore, the target surface attracts positive ions. The positive ions impact the target with a high velocity to cause the target material to physically dislodge or sputter from the target surface. The sputtered material then propagates to the workpiece to create a film of sputtered target material.

As an initial step to plasma processing, the plasma 109 is ignited. As discussed, a gas pressure within the plasma chamber 105, a size of the plasma chamber 105, the target material, and the type of workpiece 114 being processed can affect ignition behavior. To address the variable, and sometimes unpredictable, behavior of the ignition of the plasma 109, the generator 102 includes an ignition characterization component 125 that generally functions to characterize the several different ignition behaviors that may be experienced by the generator 102. As discussed further herein, each voltage waveform may be characterized in terms of an ignition profile, and in operation, a desired ignition profile may be selected and used to ignite the plasma 109 to achieve a desired ignition based upon one or more factors such as, without limitation, a gas pressure within the plasma chamber 105, a size of the plasma chamber 105, the target material, and the type of workpiece 114 being processed. Beneficially, this process of ignition characterization enables ignition profiles to be developed with well-defined criteria as opposed to prior, manual, trial and error approaches.

Figure 2:
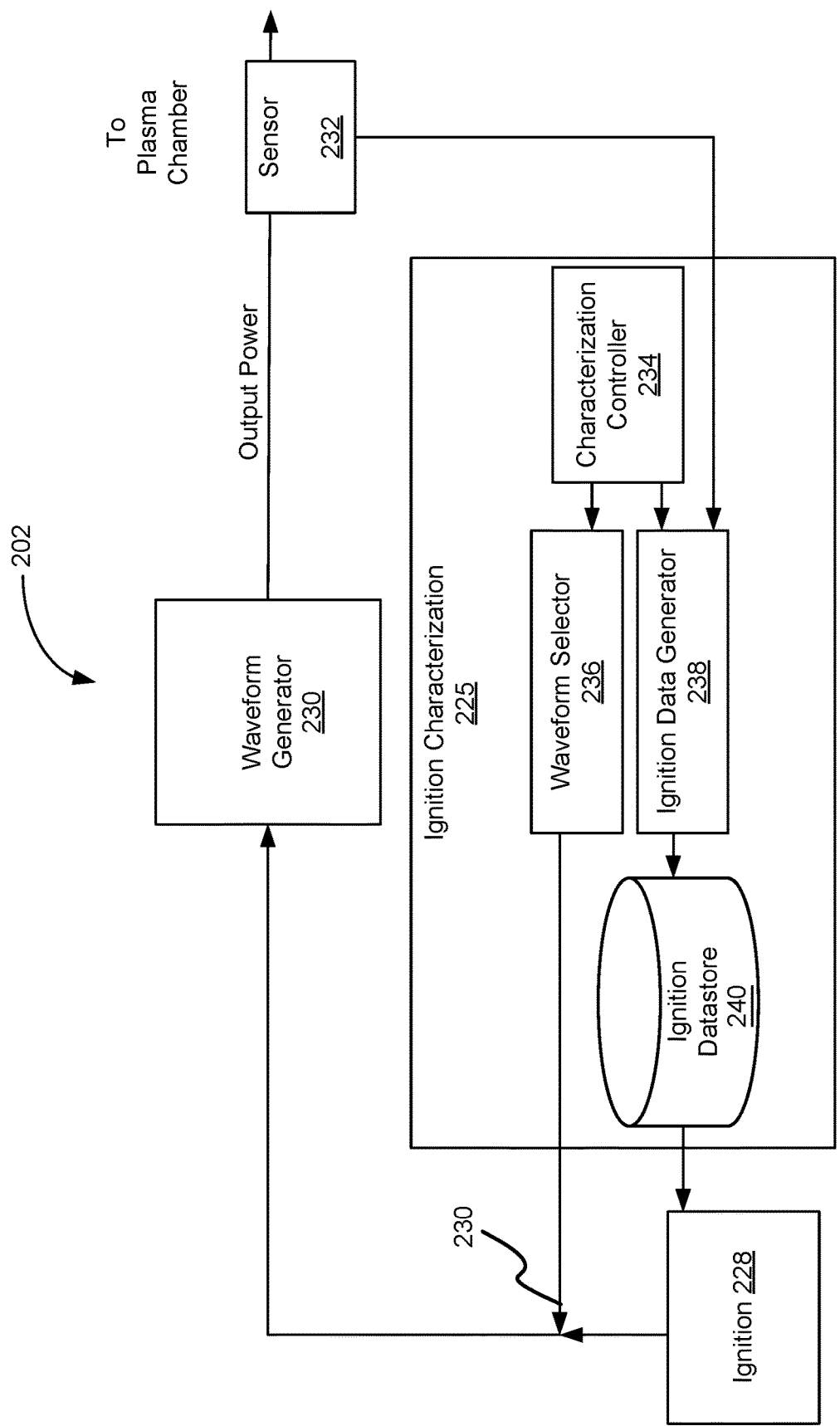
FIG. 2 is a block diagram depicting an exemplary generator that may be implemented as the generator depicted in FIG. 1.

Referring next to FIG. 2, shown is a block diagram depicting an exemplary generator 202 that may be used to implement the generator 102 depicted in FIG. 1. As shown, the generator 202 includes an ignition characterization component 225 that is coupled to an ignition module 228, a waveform generator 230, and sensor 232. As shown, the ignition characterization component 225 includes a characterization controller 234 that is coupled to a waveform selector 236 and an ignition data generator 238. An ignition datastore 240 is coupled to the ignition data generator 238 and the ignition module 228. The depiction of the components of the generator 202 in FIG. 2 is logical and it should be recognized that when implemented, the depicted functions may be realized by common constructs or further distributed.

As an example, the characterization controller 234, waveform selector 236, and ignition data generator 238 may be realized, in part, by a common central processing unit, non-volatile-memory, and random access memory that are collocated within a housing of the generator 202, and in this type of implementation, the different functional aspects of the characterization controller 234, waveform selector 236, and ignition data generator 238 may be implemented by software (processor executable instructions) that is stored in the non-volatile memory.

As another example, the waveform selector 236 and ignition data generator 238 may be realized, in part, by a common central processing unit, non-volatile-memory, and random access memory that are collocated within the housing of the generator 202 while at least a portion of the characterization controller 234 may be implemented by a separate central controller that is coupled to the generator 202 by a network connection. In this type of implementation, a user may control methodologies disclosed herein.

In yet another implementation, characterization controller 234, waveform selector 236, and ignition data generator 238 may be realized by a common central processing unit, non-volatile-memory, and random-access memory that are located remotely outside of the generator 202. It should be recognized that this potential distribution and the other potential distributions are merely exemplary and that other distributions are contemplated.

The waveform generator 230 generally functions to apply voltage waveforms that may be used to ignite the plasma 109 in the plasma chamber 105. In some implementations, the waveform generator 230 may be configured to apply a set of pre-tailored waveforms that may be adjusted in one or more aspects (e.g., one or more of maximum voltage and slope), and in other implementations, the waveform generator 230 may be configurable as an arbitrary waveform generator to provide a waveform that is completely customizable. It should be recognized that although a single block is depicted to represent the waveform generator 203, the waveform generator 230 block represents a consolidation of what may be several different components using a variety of technologies.

For example, the waveform generator 230 may be realized by well-known and/or yet-to-be-developed linear amplifier technologies to amplify a tailored source signal to produce a desired voltage waveform. Alternatively, the waveform generator 230 may be realized by well-known and/or yet-to-be developed switch-mode technologies to generate a desired waveform. Exemplary approaches to implementing the waveform generator 230 are described in U.S. patent application Ser. No. 16/405,251 entitled ADDITIVE SYNTHESIS OF INTERLEAVED SWITCH MODE POWER STAGES FOR MINIMAL DELAY IN SET POINT TRACKING and U.S. Pat. No. 9,807,863 entitled SWITCHING AMPLIFIER, which are incorporated herein by reference for all purposes.

The sensor 232 generally operates to provide one or more signals to the ignition data generator 238 that are indicative of ignition-parameter values of each voltage waveform. Ignition parameter values may include, without limitation, current, voltage, power, and phase information. Although depicted as a single block for simplicity and clarity, the sensor 232 may include several, separate sensors. The sensing technologies that may be used include voltage sensors, current sensors (current transducers), voltage-current (VI) sensors, and directional couplers. As those of ordinary skill in the art will appreciate, the sensors may sample the ignition-parameters and convert the sampled ignition parameters to a digital representation of the ignition-parameters that are provided to the ignition-data generator 238. It is also contemplated that the sensor 232 may provide analog signals that are directly utilized by the ignition data generator 238, or the ignition data generator 238 may produce and utilize a digital representation of the ignition-parameters.

In general, the waveform characterization component 225 is configured to characterize ignition of the plasma 109 in terms of one or more power parameters (e.g., ignition voltage values, current, an ignition period), which may be stored in connection with one or more characteristics of the plasma chamber 105 including for example and without limitation, chamber size, chamber dimensions, information about pressure, constituent chemical processing gases, target material, and the workpiece.

More specifically, the ignition characterization component 225 may operate to apply (and assess) N voltage waveforms to the plasma chamber 105. For example, each of the N waveforms may be repeatedly applied to the plasma chamber 105, and each time the plasma 109 is ignited in the plasma chamber 105, ignition-parameter values (ignition voltage, current, and ignition duration) of each voltage waveform may be obtained. Based upon the repetitive testing of a particular waveform, an ignition profile for the particular waveform may be created and stored in the ignition datastore 240.

As shown, the ignition characterization component 225 includes a waveform selector 236, which generally functions, in connection with the characterization controller 234, to enable waveforms to be selected and then effectuated by the waveform generator 230. In some implementations, the waveform selector 236 may be configured with predefined waveforms that may be selected, and in some variations, the characterization controller 234 in connection with the waveform selector 236 may enable a user to define waveforms that may be selected.

The ignition data generator 238 generally operates to produce data that may be used to characterize ignition of voltage waveforms that are applied by the waveform generator 230. As shown, the ignition data generator 238 is coupled to both the characterization controller and the sensor 232. In operation, the ignition data generator 238 may receive data from the characterization controller 234 and data from the sensor 232 to produce an ignition profile. For example, the characterization controller 234 may be configured to provide information about the plasma chamber 105 and the environment within the plasma chamber. More specifically, one or more of gas pressure, chamber size, target material, and workpiece type may be obtained. In addition, the sensor 232 may provide a signal indicative of the current and voltage that is applied by the waveform generator 230.

In addition, the ignition data generator 238 may be configured to detect when the plasma is ignited within the plasma chamber, and the ignition data generator 238 may also be configured with a timer to produce a time stamp that is associated with the ignition-parameter values that are obtained as a waveform is applied and as ignition is detected. As those of ordinary skill in the art will appreciate, ignition of the plasma 109 may be detected based upon the level of current that is provided by the generator 102 (e.g., ignition may be detected when the current reaches a threshold). The increase in current is due to the impedance (that is seen by the generator 102) dropping when gasses (that have a relatively high impedance) in the plasma chamber 105 ionize to produce the plasma 109 that has a relatively low impedance.

As discussed in more detail further herein, the characterization controller 234, in connection with the waveform selector 236, may prompt the waveform generator 230 to apply the same waveform multiple times (e.g., five or more times) to enable the ignition data generator 238 to obtain multiple samples (e.g., five or more waveform samples). After obtaining multiple samples, the ignition data generator 238 may perform a statistical analysis of the multiple samples to produce the ignition profile. For example, an elapsed time to ignition may be captured during each application of a particular waveform, and average and standard deviation may be obtained for the elapsed time.

Figure 3:
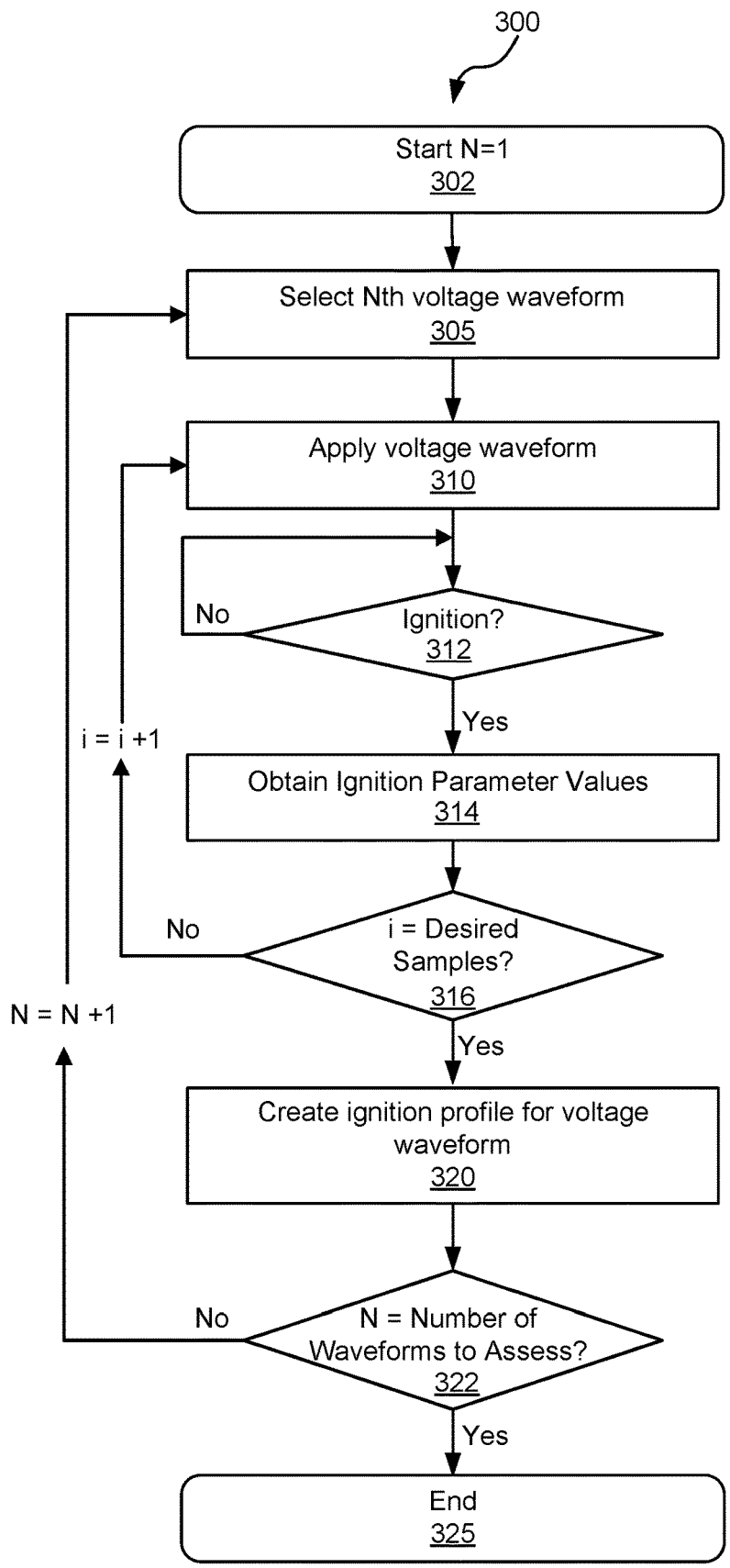
FIG. 3 is a flowchart depicting an exemplary method that may be traversed in connection with embodiments disclosed herein.
Figure 4A:
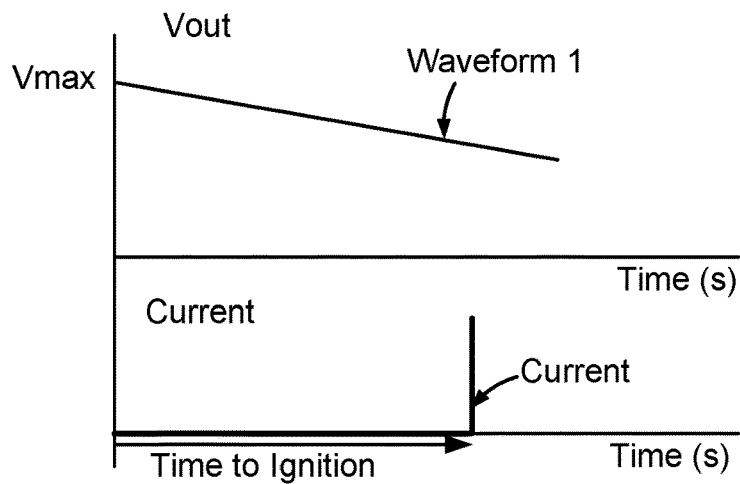
FIGS. 4A-4C depict aspects of voltage and current associated with three exemplary waveforms, respectively.
Figure 4B:
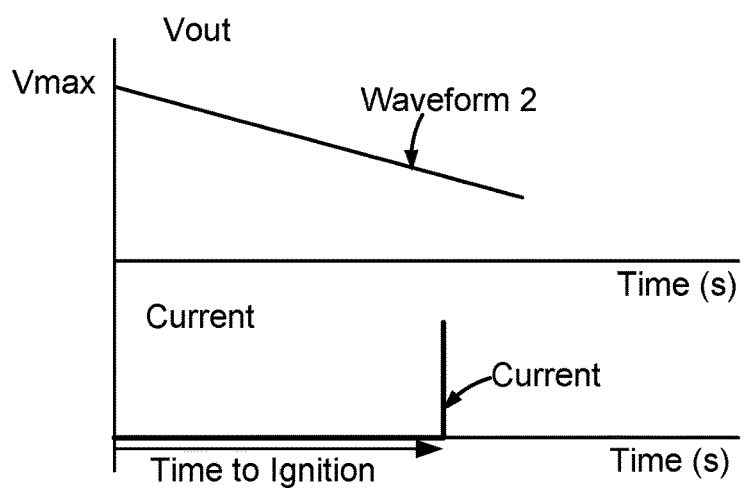
Figure 4C:
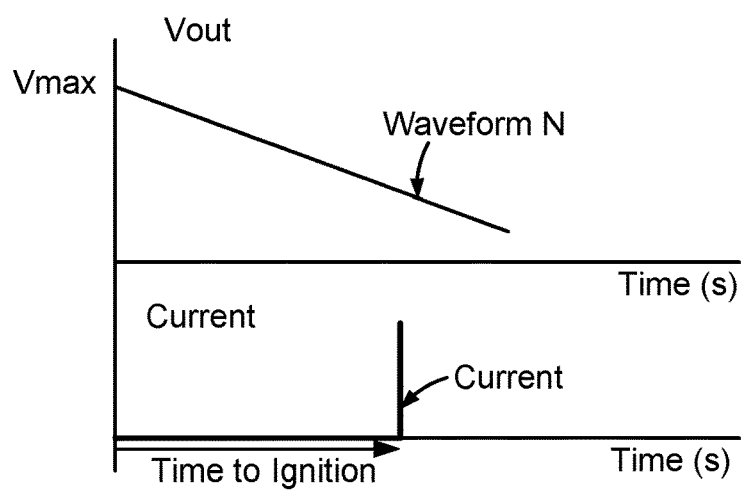

Referring next to FIG. 3, shown is a flowchart depicting an exemplary method that may be carried out with embodiments disclosed herein to create N ignition profiles for N voltage waveforms. Referring briefly to FIGS. 4A to 4C for example, shown is a first waveform, a second waveform, and an Nth waveform, respectively. As shown, each of the N waveforms has a different slope while having a same initial voltage of Vmax. As shown, a time to ignition (also referred to herein as an ignition duration) is shown for each of the N waveforms (as a time from a start of the application of the voltage until ignition occurs), and ignition is assumed to occur when the current rises to exceed a threshold. The ignition duration may vary depending upon several factors discussed herein, but exemplary ignition durations may be between about 50 ms and 500 ms, but these durations are only examples.

The exemplary waveforms in FIGS. 4A-4C start at Vmax and decrease in magnitude for the ignition duration. Vmax may be, for example, between 1000 and 1500 volts, and Vmax may be an ignition parameter that is varied when different waveforms are tested. Vmax may also be a parameter that is constrained when, for example, there is a desire to limit the voltage that is applied to the plasma chamber 105. As another example, ignition duration be constrained to arrive at viable waveforms that achieve ignition in less than a maximum number of seconds. It should be recognized that the waveforms in FIGS. 4A through 4C depict only examples of waveforms that may be applied to the plasma chamber 105, and that waveforms that have a positive slope, waveforms that do not a constant slope, and waveforms that increase and decrease during the time to ignition (also referred to as an ignition duration) are also contemplated. The waveforms may be characterized in terms of several parameters, such as, for example, frequency content, maximum voltage, fall time, and rise time.

Referring again to FIG. 3, for a first selected waveform, i.e., N=1, (Blocks 302 and 304), the first waveform is repeatedly applied i times (Blocks 310, 312, 314) from a start of the waveform to ignition until i is equal to a desired number of iterations (Block 316). As an example, the desired number of iterations may be 5, 10, or 20 iterations, but these are merely examples. During each iteration, the waveform is applied (Block 310) until there is an ignition (Block 312) of the plasma 109 in the plasma chamber 105. Each time the plasma 109 is ignited in the plasma chamber 105 (Block 312), ignition parameter values are obtained (Block 314). As a consequence, i sets of ignition parameter values may be obtained after i iterations of Blocks 310 to 316.

Figure 5A:
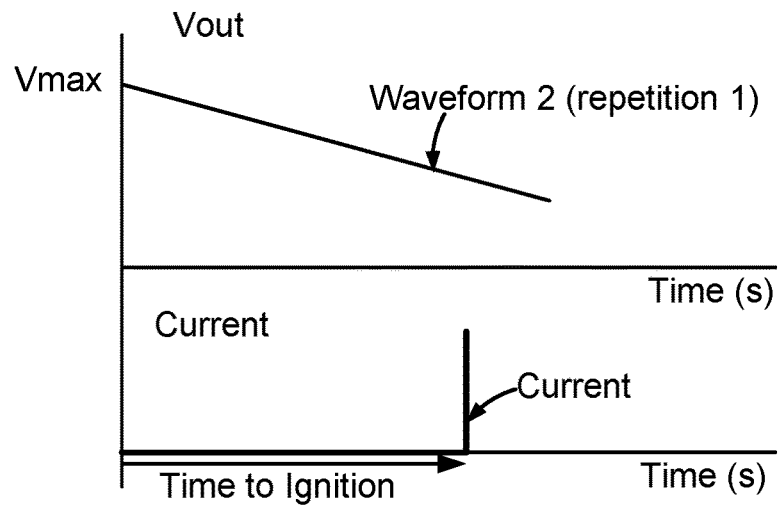
FIGS. 5A-5C depict aspects of voltage and current during repetitive application of a waveform.
Figure 5B:
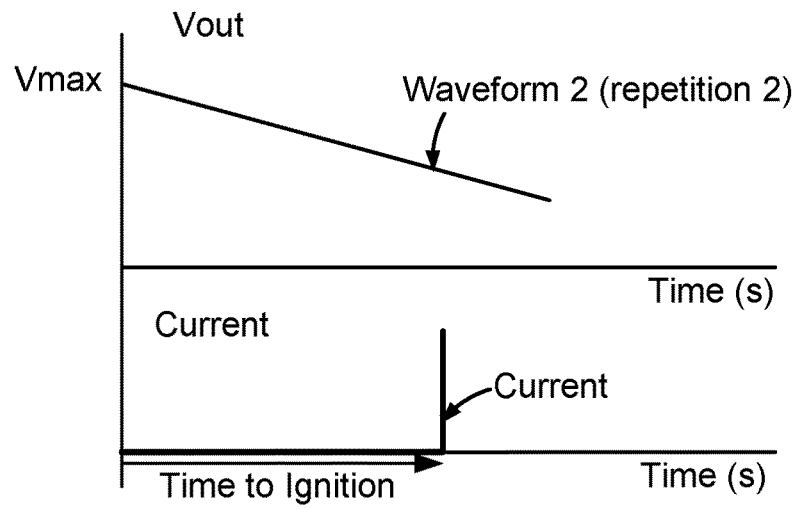
Figure 5C:
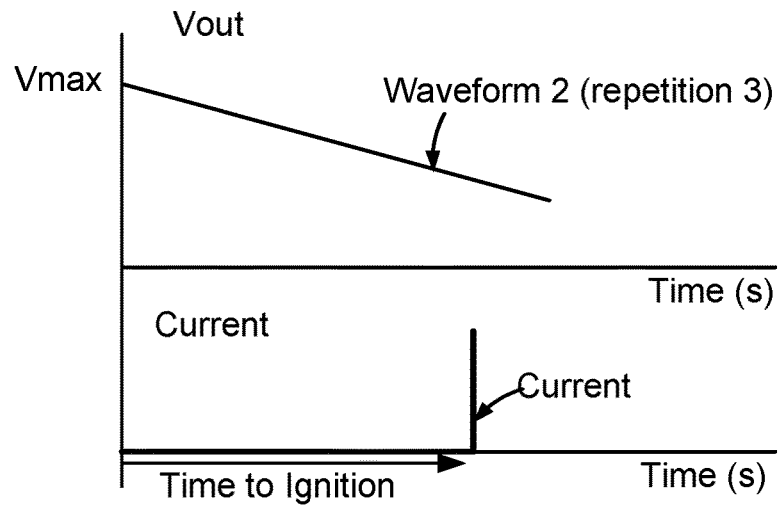
Figure 6A:
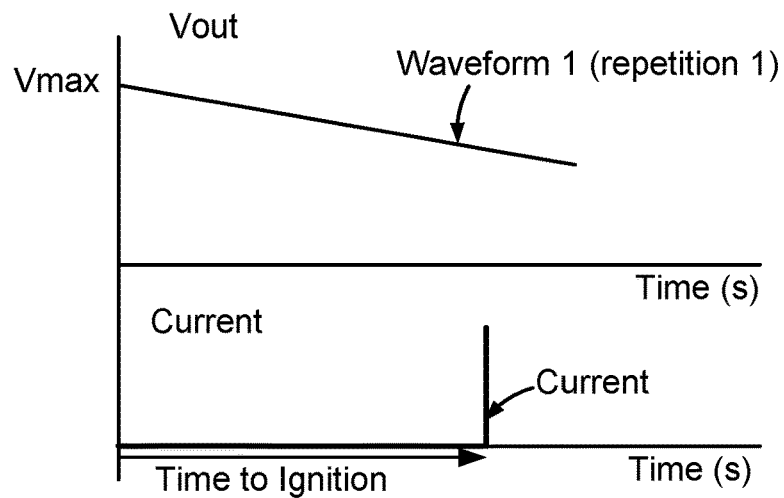
FIGS. 6A-6C depict aspects of voltage and current during repetitive application of another waveform.
Figure 6B:
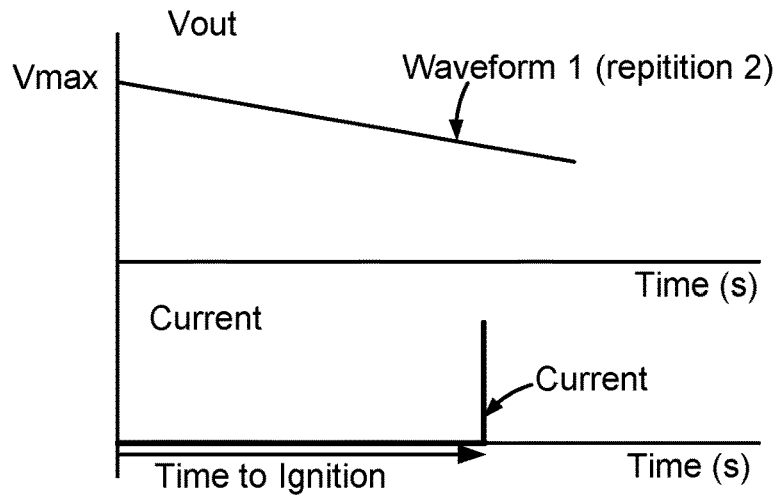
Figure 6C:
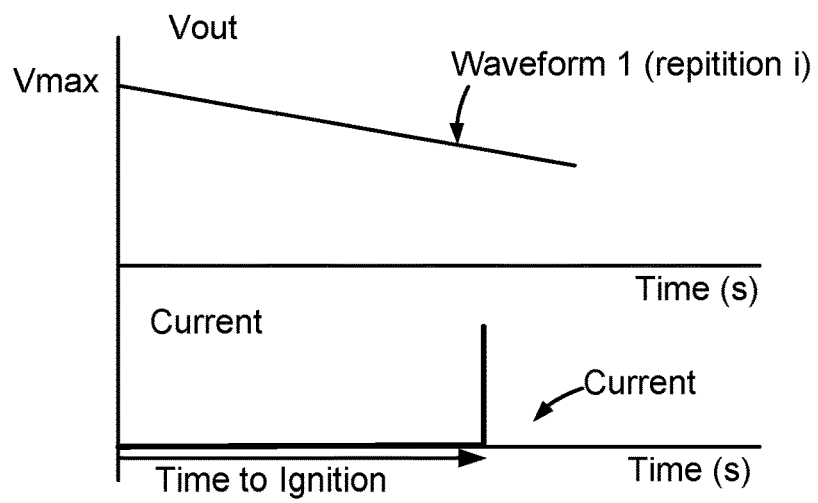

Referring briefly to FIGS. 5A-5C shown are three iterations of an application of waveform 2 in FIG. 4B, and FIGS. 6A-6C shows three iterations of an application of waveform 1 in FIG. 4A. When contrasting the time to ignition of waveform 2 in FIGS. 5A-5C to the time to ignition of waveform 1 in FIGS. 6A-6C, the time to ignition of waveform 2 is generally less than the time to ignition of waveform 1, but waveform 1 provides a more consistent ignition. In some instances, an operator of the plasma chamber 105 may prefer a short ignition duration over a consistent ignition duration; thus, the operator may prefer waveform 2 over waveform 1. But in other instances, the operator may prefer a more consistent ignition duration, so the operator may prefer waveform 1 over waveform 2.

For ease of comparing and contrasting waveforms, an ignition profile may be obtained for the voltage waveform (Block 320). For example, a statistical evaluation of the ignition-parameter values may be performed to arrive at an ignition profile for each waveform. By way of further example, an average and standard deviation of an ignition-parameter may be obtained and stored in the ignition datastore 240. Having an average and standard deviation of the ignition duration of both of waveforms 1 and 2 enables a quick comparison between the ignition profiles of waveforms 1 and 2.

In some implementations, at Block 305, when a voltage waveform is selected, an aspect of the waveform (e.g., slope, starting voltage, frequency etc.) may be incrementally changed and then Blocks 310-322 may be repeated for each incremental change. The incremental changes that are made may be manually made and/or many be automatically made by the characterization controller 234 and waveform selector 236.

Ignition profiles may be stored in the ignition datastore 240 and then accessed by the ignition component 228 to select and prompt the waveform generator 230 to apply a particular voltage waveform to the output of the generator 102 based upon the selected particular ignition profile. It is contemplated that data for one or more of gas pressure, chamber size, cathode material, and workpiece type may be stored in connection with ignition parameter values.

Figure 7:
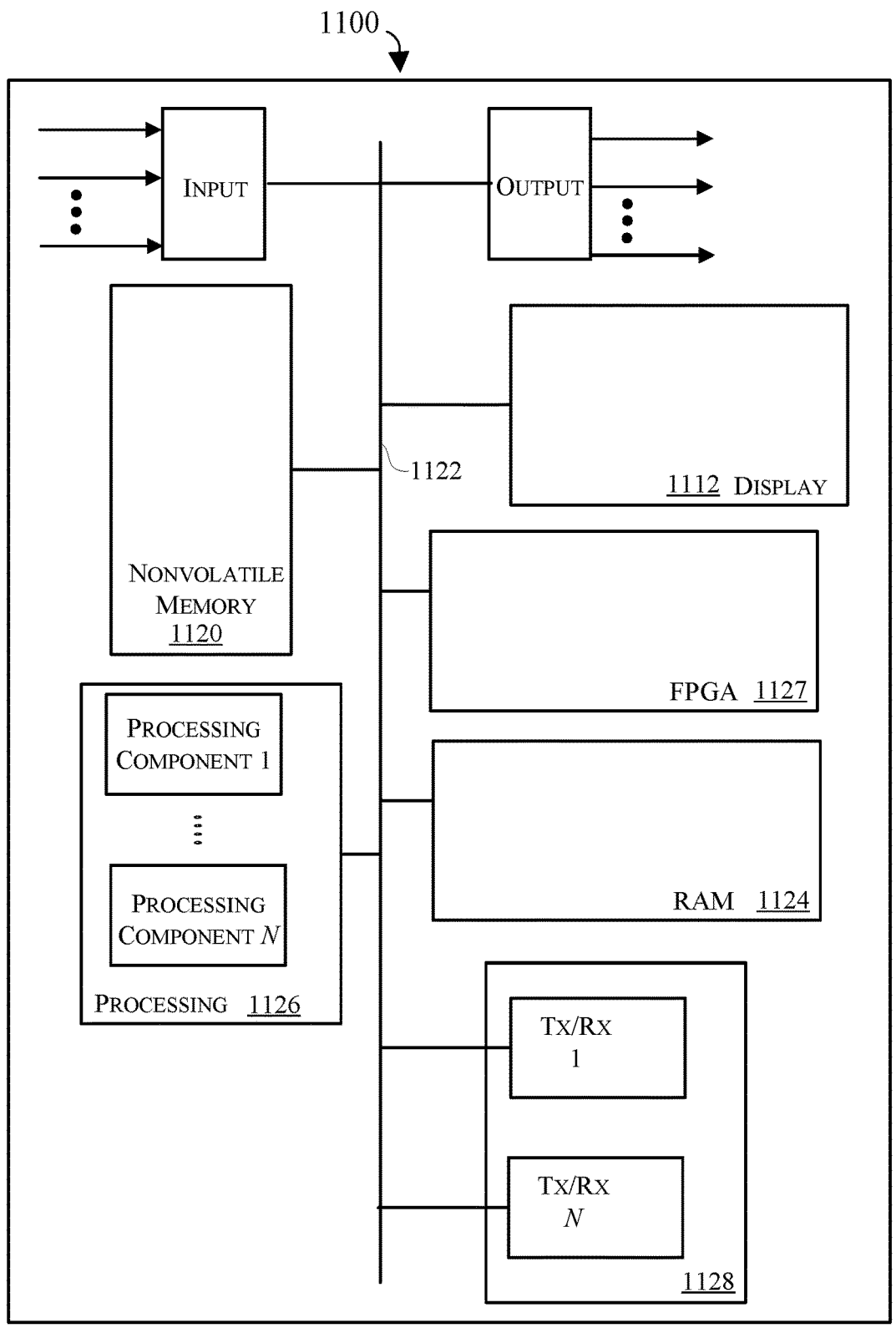
FIG. 7 depicts computing components that may be used in connection with embodiments disclosed herein.

The functions and methods described in connection with the embodiments disclosed herein may be effectuated utilizing hardware, in processor executable instructions encoded in non-transitory machine readable medium, or as a combination of the two. Referring to FIG. 7 for example, shown is a block diagram depicting physical components that may be utilized to realize aspects of the ignition characterization component 125. As shown, in this embodiment a display portion 1112 and nonvolatile memory 1120 are coupled to a bus 1122 that is also coupled to random access memory ("RAM") 1124, a processing portion (which includes N processing components) 1126, a field programmable gate array (FPGA) 1127, and a transceiver component 1128 that includes N transceivers. Although the components depicted in FIG. 7 represent physical components, FIG. 7 is not intended to be a detailed hardware diagram; thus, many of the components depicted in FIG. 7 may be realized by common constructs or distributed among additional physical components. Moreover, it is contemplated that other existing and yet-to-be developed physical components and architectures may be utilized to implement the functional components described with reference to FIG. 7.

The display 1112 generally operates to provide a user interface for a user, and in several implementations, the display 1112 is realized by a touchscreen display. For example, display 1112 can be implemented as a part of the characterization controller 234 to enable a user to control aspects of the ignition characterization process. For example, a user may enter values that define constraints for the voltage waveforms, parameters to be optimized, one or more values to define how much parameters may change between each of the N waveforms that are tested; and number of samples to obtain for each waveform applied (e.g., a value for i in the method described with reference to FIG. 3). The display 1112 may also enable a user to customize a shape of the voltage waveforms that are applied.

In general, the nonvolatile memory 1120 is non-transitory memory that functions to store (e.g., persistently store) data and machine readable (e.g., processor executable) code (including executable code that is associated with effectuating the methods described herein). In some embodiments, for example, the nonvolatile memory 1120 includes bootloader code, operating system code, file system code, and non-transitory processor-executable code to facilitate the execution of the methods described with reference to FIG. 3 described above. The nonvolatile memory 1120 may also be used to realize the ignition datastore 240.

In many implementations, the nonvolatile memory 1120 is realized by flash memory (e.g., NAND or ONENAND memory), but it is contemplated that other memory types may also be utilized. Although it may be possible to execute the code from the nonvolatile memory 1120, the executable code in the nonvolatile memory is typically loaded into RAM 1124 and executed by one or more of the N processing components in the processing portion 1126.

In operation, the N processing components in connection with RAM 1124 may generally operate to execute the instructions stored in nonvolatile memory 1120 to realize the functionality of the generator 102, 202. For example, non-transitory processor-executable instructions (to effectuate the functions of the ignition characterization component 225, the ignition module 228, and the waveform generator 230) may be persistently stored in nonvolatile memory 1120 and executed by the N processing components in connection with RAM 1124. As one of ordinary skill in the art will appreciate, the processing portion 1126 may include a video processor, digital signal processor (DSP), graphics processing unit (GPU), and other processing components.

In addition, or in the alternative, the field programmable gate array (FPGA) 1127 may be configured to effectuate one or more aspects of the functions and methodologies described herein. For example, non-transitory FPGA-configuration-instructions may be persistently stored in nonvolatile memory 1120 and accessed by the FPGA 1127 (e.g., during boot up) to configure the FPGA 1127 to effectuate the functions of the ignition characterization component 225.

The input component may operate to receive signals (e.g., from sensor 232) that are indicative of one or more properties of the output generator power and/or the plasma load in plasma processing chamber 105. The signals received at the input component may include, for example, voltage, current, forward power, reflected power, and plasma load impedance. The output component generally operates to provide one or more analog or digital signals to effectuate an operational aspect of the generator 102, 202. For example, the output portion may transmit a signal indicative of a controlled parameter (such as voltage and/or frequency) to the waveform generator 230.

The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system for igniting a plasma in a plasma chamber, the system comprising:
   a waveform generator configured to produce and apply voltage waveforms at an output port configured to couple to a plasma processing chamber;
   an ignition characterization component configured to generate N ignition profiles for N corresponding voltage waveforms, wherein the ignition characterization component is configured to generate each particular one of the N ignition profiles by:
   repeatedly applying a particular voltage waveform to the output port to obtain a plurality of waveform samples for the particular voltage waveform;
   obtaining, each time a plasma is ignited in the plasma chamber during an application of the particular voltage waveform, ignition-parameter values from the plurality of waveform samples;
   create and store an ignition profile in an ignition datastore for the particular voltage waveform, wherein the ignition profile is based upon a statistical average for one or more of the ignition-parameter values; and
   an ignition component configured to access the ignition datastore to select and prompt the waveform generator to apply one of the N voltage waveforms to the output port based upon a particular ignition profile for the selected one of the N voltage waveforms.

2. The system of claim 1, wherein the ignition characterization component is configured to detect ignition of the plasma in the plasma chamber.

3. The system of claim 1, wherein the ignition-parameters include one or more of ignition voltage, current, and ignition duration.

4. The system of claim 1, wherein the ignition characterization component is configured to obtain, for each voltage waveform, a statistical average for one or more of the ignition-parameter values to create the ignition profile.

5. The system of claim 4, wherein the ignition characterization component is configured to obtain and store, in connection with each ignition profile, data for one or more of gas pressure, chamber size, cathode material, and substrate type.

6. A method for adaptive plasma ignition, the method comprising:
   assessing each of N voltage waveforms, wherein the assessing includes:
   selecting, from among the N voltage waveforms, a particular voltage waveform to apply to a plasma processing chamber;
   applying, repeatedly, the particular voltage waveform to the plasma processing chamber, wherein each application of the particular voltage waveform results in plasma ignition;
   obtaining, each time a plasma is ignited in the plasma chamber, ignition-parameter values of each voltage waveform;
   obtaining, for each of the N voltage waveforms, a statistical average for one or more of the ignition-parameter values; and
   creating and storing an ignition profile in an ignition datastore for the particular voltage waveform, wherein the ignition profile is based upon the statistical average.

7. The method of claim 6, including detecting ignition of the plasma by monitoring one or more of the ignition-parameter values.

8. The method of claim 6, wherein obtaining ignition-parameter values includes obtaining one or more values of ignition voltage, current, and ignition duration.

9. The method of claim 6 including obtaining and storing, in connection with each ignition profile, data for one or more of gas pressure, chamber size, cathode material, and substrate type.

10. A non-transitory processor-readable medium encoded with instructions for adaptive plasma ignition, the instructions including instructions to:
    assess each of N voltage waveforms, wherein the assessing includes:
    selecting, from among the N voltage waveforms, a particular voltage waveform to apply to a plasma processing chamber;
    applying, repeatedly, the particular voltage waveform to the plasma processing chamber, wherein each application of the particular voltage waveform results in plasma ignition;
    obtaining, each time a plasma is ignited in the plasma chamber, ignition-parameter values of each voltage waveform;
    obtaining, for each of the N voltage waveforms, a statistical average for one or more of the ignition-parameter values; and
    creating and storing an ignition profile in an ignition datastore for the particular voltage waveform, wherein the ignition profile is based upon the statistical average.

11. The non-transitory processor-readable medium of claim 10, including detecting ignition of the plasma by monitoring one or more of the ignition-parameter values.

12. The non-transitory processor-readable medium of claim 10, wherein obtaining ignition-parameter values includes obtaining one or more values of ignition voltage, current, and ignition duration.

13. The non-transitory processor-readable medium of claim 10 including obtaining and storing, in connection with each ignition profile, data for one or more of gas pressure, chamber size, cathode material, and substrate type.

* * * * *